United States Patent
Pu et al.

(10) Patent No.: US 9,762,259 B1
(45) Date of Patent: Sep. 12, 2017

(54) SIGMA-DELTA ANALOG-TO-DIGITAL CONVERTER WITH AUTO TUNABLE LOOP FILTER

(71) Applicant: TEXAS INSTRUMENTS INCORPORATED, Dallas, TX (US)

(72) Inventors: Xiao Pu, Plano, TX (US); Krishnaswamy Nagaraj, Plano, TX (US); Peng Cao, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/401,957

(22) Filed: Jan. 9, 2017

(51) Int. Cl.
  *H03M 3/00* (2006.01)
  *H03M 1/12* (2006.01)
  *H03M 1/46* (2006.01)

(52) U.S. Cl.
  CPC ......... *H03M 3/436* (2013.01); *H03M 1/1245* (2013.01); *H03M 1/46* (2013.01); *H03M 3/424* (2013.01); *H03M 3/458* (2013.01)

(58) Field of Classification Search
  CPC ...... H03M 3/454; H03M 3/458; H03M 3/392; H03M 3/344; H03M 3/38; H03M 3/33; H03M 3/30; H03M 3/37; H03M 3/482; H03M 7/3013
  USPC ......................................... 341/120, 121, 143
  See application file for complete search history.

(56) References Cited

U.S. PATENT DOCUMENTS

| 5,392,039 | A | * | 2/1995 | Thurston | H03M 3/358 341/143 |
| 7,486,214 | B1 | * | 2/2009 | Di Giandomenico | H03M 3/386 327/552 |
| 7,570,182 | B2 | * | 8/2009 | Sheba | G04F 10/005 341/118 |
| 2004/0201508 | A1 | * | 10/2004 | Krone | H03L 7/18 341/143 |
| 2005/0017883 | A1 | * | 1/2005 | Lee | H03F 1/304 341/118 |
| 2005/0237233 | A1 | * | 10/2005 | Muhammad | H03M 3/392 341/143 |
| 2014/0266828 | A1 | * | 9/2014 | Matsukawa | H03H 11/0433 341/143 |
| 2015/0145567 | A1 | * | 5/2015 | Perrott | H03L 7/093 327/156 |
| 2015/0280733 | A1 | * | 10/2015 | Aboushady | H03M 3/408 341/143 |

* cited by examiner

*Primary Examiner* — Linh Nguyen
(74) *Attorney, Agent, or Firm* — John R. Pessetto; Charles A. Brill; Frank D. Cimino (57) ABSTRACT

A notch filter in a sigma-delta modulator loop filter increases SNR by limiting in-band quantization noise around a frequency to which the notch filter is precisely tuned. A tuning mode controller isolates the notch filter from other loop filter stages. A bias voltage is applied to the notch filter, causing it to resonate. Tuning mode switches insert the notch filter into a frequency-locked loop ("FLL") circuit as a variable frequency oscillator component of the FLL. An ADC operational mode input signal is applied to the FLL as a reference signal. A tuning control component of the FLL adjusts a tunable feedback element in the notch filter to drive the FLL error signal to zero in order to precisely tune the notch filter to the center frequency of the ADC input signal. Tuning inputs to the tunable feedback element are then latched prior to re-inserting the notch filter into the modulator.

20 Claims, 4 Drawing Sheets

SIGMA-DELTA ANALOG-TO-DIGITAL CONVERTER WITH AUTO TUNABLE LOOP FILTER

TECHNICAL FIELD

Embodiments described herein relate to analog-to-digital conversion, including structures and methods associated with loop filter tuning to increase in-band signal-to-noise ratio in a sigma-delta modulator.

BACKGROUND INFORMATION

Analog-to-digital converters ("ADCs") are an important means of providing inputs from a largely analog natural world to today's largely digital computing environment. One problem with ADC technology is that an ADC necessarily divides an analog input signal into discrete levels or steps capable of being interpreted by a binary computing system. Analog signal magnitude variations which occur between minimum step levels are not captured by the ADC. And, error components result if the ADC generates unequal digital output steps. Consequently, the digital translation of the analog input signal is, generally speaking, inexact.

Technology advances have created a need to translate analog inputs with increasingly finer resolutions. Various ADC circuit architectures such as sub-ranging/pipelined, successive approximation, flash and sigma-delta have been developed to provide resolution/bandwidth trade-offs appropriate to various applications. The sigma-delta ADC can provide very high resolution of relatively low bandwidth telemetry signals such as flow meter transducer outputs.

Figure 1:
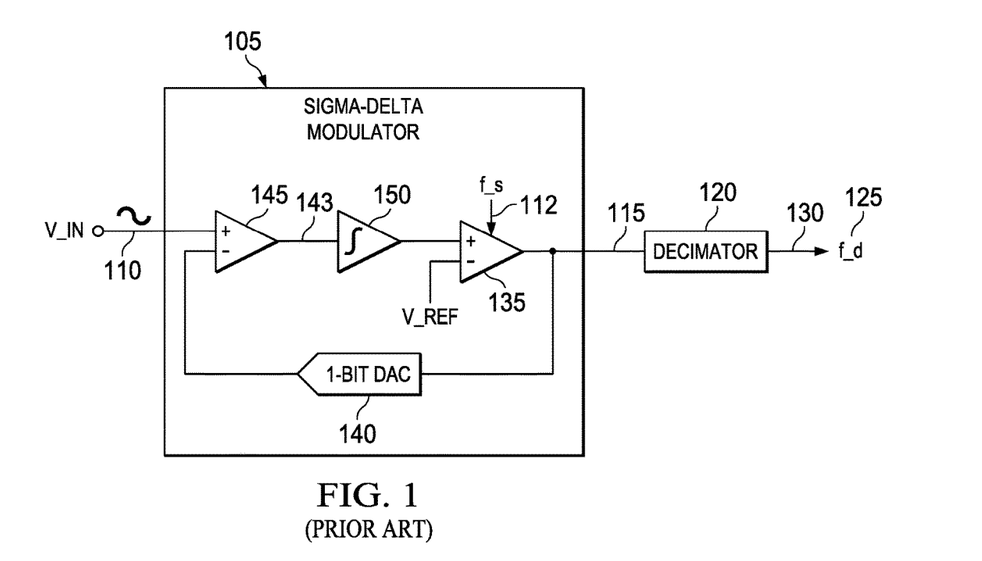
FIG. 1 is a prior-art block diagram of a sigma-delta ADC including a single bit sigma-delta modulator.

FIG. 1 is a prior-art block diagram of a sigma-delta ADC 100 including a single bit, two-level sigma-delta modulator 105 The modulator 105 oversamples an analog signal appearing at a modulator input terminal 110 at a rate f s 112. The modulator 105 generates a pulse density modulated pulse stream at an output terminal 115. The ratio of a count of a number of pulses (i.e., a count of a number of binary logical 1's) in the pulse stream divided by a total number of samples clocked during a known interval represents the instantaneous magnitude of the analog signal at the input terminal 110 during the interval. Individual samples of any given point of the input waveform are accumulated over time and averaged by a decimator 120. The decimator 120 generates an ADC output word at a data rate f_d 125 at an output terminal 130.

The sigma-delta modulator 105 includes a comparator 135 which acts as a single-bit quantizer to convert the analog input signal to a one or zero level coarse output at each sampling time. As with any quantizer, the comparator 135 output includes a quantization error. The modulator 105 also includes a single-bit digital-to-analog converter ("DAC") 140 as a negative feedback element. The DAC 140 responds to each transition of the comparator 135 by changing an analog output error signal at an output terminal 143 of a difference amplifier 145. The analog output error signal at the terminal 143 includes quantization noise. The feedback loop operates to drive the error signal to zero such that the output of the DAC 140 becomes equal to the analog signal appearing at the modulator input terminal 110.

An integrator 150 combined with the sampling strategy outlined above shapes the quantization noise by pushing the noise energy into higher frequency spectra, away from input signal frequencies. The latter process is described mathematically and referred to generally as the "noise transfer function" ("NTF"). Thus, the sigma-delta ADC architecture reduces quantization noise relative to some other architectures.

Figure 2:
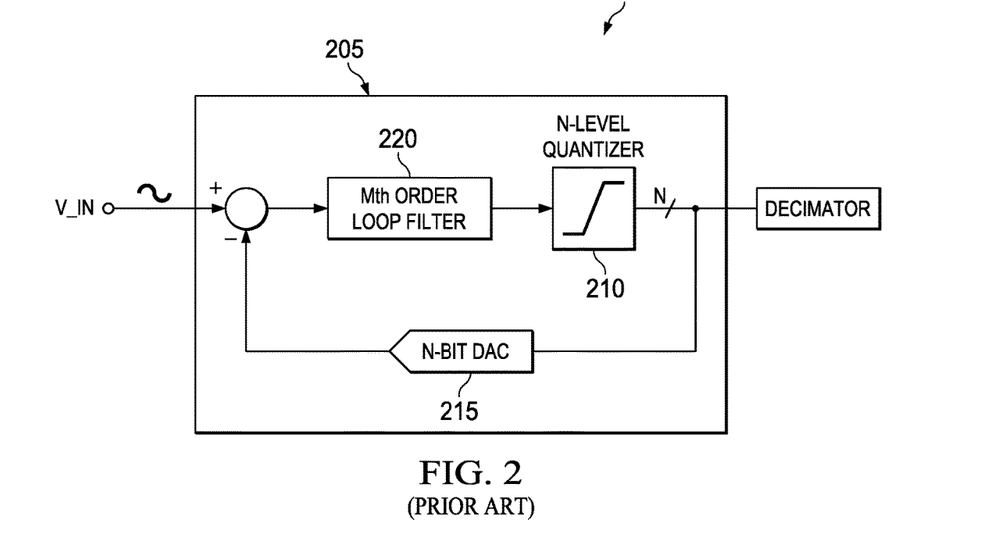
FIG. 2 is a prior-art block diagram of a sigma-delta ADC including an $M^{th}$ order loop filter and an N-level sigma-delta modulator.

FIG. 2 is a prior-art block diagram of a sigma-delta ADC 200 including an N-level sigma-delta modulator 205. The N-level modulator 205 encodes $\log_2 N$ binary output bits, typically on N one-hot coded bit output lines. The modulator 205 includes an N-level quantizer 210 rather than the 2-level comparator 135 of FIG. 1. At each sampling time the N-level quantizer 210 resolves the analog signal at its input to one of the N levels and sets the output line corresponding to the resolved level to a binary logical 1 state. The other N−1 output lines not corresponding to the resolved level are set to a binary logical 0 state. The modulator 205 also includes an N-level DAC feedback element 215 rather than the 1-bit, two output-level DAC feedback element 140 of FIG. 1.

The N-level sigma-delta modulator 205 is capable of operation at lower sampling frequencies than the two-level modulator 105 for a given resolution. Alternatively, the N-level modulator 205 provides higher resolution than the 2-level modulator 105 at a given sampling frequency. The dynamic range of the N-level modulator 205 is also greater that of the 2-level modulator 105.

The modulator 205 also includes an $M^{th}$ order loop filter 220 rather than the first-order loop filter of the modulator 105 implemented as a single integrator 150. A higher order loop filter provides a steeper NTF, pushing more quantization noise into higher frequency bands and away from the desired signal band.

Certain applications use sigma-delta ADCs to convert narrow-band sensor data, as previously mentioned. Different models of sensors useful for the same application may operate at different center frequencies. While it may be convenient to be able to interchange sensors, a sigma-delta ADC designed for a lower frequency range may suffer from decreased signal-to-noise ratio ("SNR") when presented with input signal frequency components extending above the ADC's NTF design parameters.

SUMMARY OF THE INVENTION

Structures and methods described herein implement a tunable notch filter in an integrating chain of loop filter stages of a sigma-delta modulator portion of an ADC. For narrow bandwidth applications such as the measurement of times of arrival of continuous-wave pulses, these embodiments provide a notch in the NTF to achieve a desired SNR over the narrow band of interest while decreasing the oversampling ratio ("OSR") compared to that of a conventional sigma-delta modulator. For example, it may be desirable to utilize a measurement system employing an ADC designed for good SNR performance from DC to 2 MHz with a transducer operating at a center frequency of 4 MHz. Doing so would generally result in a degraded SNR as higher frequency components of the input signal begin to overlap the NTF quantization noise envelope.

A notch filter in the modulator loop filter integration chain increases SNR by modifying the NTF associated with the sigma-delta modulator to limit in-band quantization noise around a frequency to which the notch filter is tuned. For the narrow-band transducer example discussed above, the notch filter would be tuned to the transducer operational center frequency.

Structures and methods disclosed herein also include an auto-tuning circuit capable of such notch filter tuning to the input signal operational center frequency. A tuning mode controller initiates a tuning mode of operation by opening switches at notch filter input and output terminals in order to isolate the notch filter from other loop filter stages. The tuning mode switches also apply a bias voltage to the notch filter input terminal. The bias voltage places the isolated notch filter at an operating point sufficient to cause it to resonate and thus effectively converts the notch filter into an oscillator.

The tuning mode switches also insert the resonating notch filter into a frequency-locked loop ("FLL") circuit as a variable frequency oscillator ("VFO") component of the FLL. A clock signal having a frequency substantially equal to that of the ADC operational mode signal (e.g., a transducer center frequency as in the example presented above) is applied to the FLL as a reference. A tuning control component of the FLL then adjusts a tunable feedback element in the tunable notch filter to drive the FLL error signal to zero. At that point the notch filter/resonator is precisely tuned to match the center frequency of the ADC input signal. Tuning inputs to the tunable feedback element are then latched such that, during normal ADC operational mode the notch filter center frequency remains fixed at the ADC input signal center frequency to which the notch filter was tuned.

It is noted that the notch filter is variously referred to herein as a "notch filter," a "resonator," or a "notch filter/resonator." It is understood that the structure described in detail below as a notch filter performs a notch filter function when inserted into the sigma-delta modulator integrator chain during normal ADC operational mode and performs a resonator function when inserted into the FLL auto-tuning circuit for tuning mode operation.

DETAILED DESCRIPTION

Figure 3:
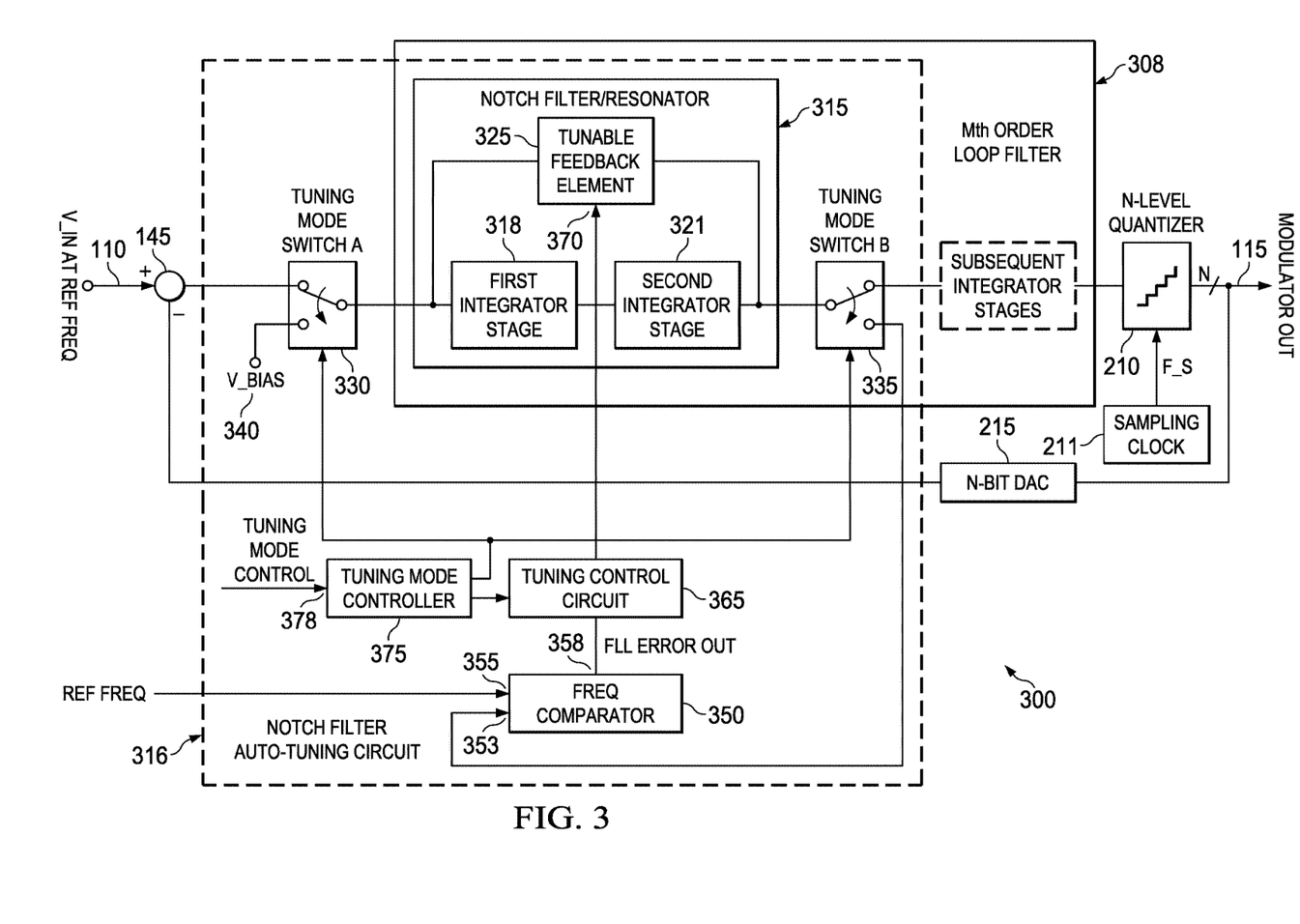
FIG. 3 is a block diagram of a sigma-delta modulator associated with an ADC, including a tunable notch filter portion of a modulator loop filter according to various example embodiments of the invention.

FIG. 3 is a block diagram of a sigma-delta modulator 300 associated with a sigma-delta ADC (decimator not shown) according to various example embodiments. The modulator 300 includes a multi-order modulator loop filter 308. Included in the chain of integrators forming the loop filter 308 is a tunable notch filter 315, further described below. The modulator 300 also includes an input terminal 110, an output terminal 115, a difference amplifier 145, an N-level quantizer 210, a sampling clock 211 and an N-bit DAC 215, the latter components as previously described with reference to FIGS. 1 and 2.

In an example embodiment, the tunable notch filter 315 includes a first loop filter integrator stage 318, a second loop filter integrator stage 321, and a tunable feedback element 325. The tunable feedback element 325 is coupled between an output terminal of the second loop filter integrator stage 321 and an input terminal of the first loop filter integrator stage 318. In such an embodiment, the frequency of resonance of the tunable notch filter 315 is determined by a parametric value of the tunable feedback element 325.

For example, in some embodiments the tunable feedback element 325 includes a switched resistor network (not shown) from which to select a series/parallel sub-combination of resistors. For such an embodiment, the parametric value of the tunable feedback element is a resistance value established by digital control line inputs to the tunable feedback element 325. In the latter case the tuning control signal is a binary word.

The modulator 300 includes an auto-tuning circuit 316 according to various example embodiments of the invention. The auto-tuning circuit 316 is capable of being activated during a tuning mode of operation and employs an FLL to tune the notch filter 315 to a center frequency of an input signal to be converted by the ADC.

The auto-tuning circuit 316 includes a set of tuning mode switches (e.g., the tuning mode switches 330 and 335) coupled to input and output terminals of the tunable notch filter 315. The tuning mode switches isolate the tunable notch filter 315 from the other portions of the modulator loop filter 308 and switch the notch filter 315 into the FLL during tuning mode operation. In some embodiments, for example, a first tuning mode switch 330 is coupled to the input terminal of the first loop filter integrator stage 318. The first tuning mode switch 330 disconnects an input of the tunable notch filter 315 from an output terminal of the modulator difference amplifier 145 and connects the input of the tunable notch filter 315 to a bias voltage source 340. Doing so provides an appropriate input common mode voltage to the first integrator stage.

A second tuning mode switch 335 is coupled to the output terminal of the second loop filter integrator stage 321. The second tuning mode switch 335 disconnects an output of the tunable notch filter 315 from subsequent loop filter integrator stages and connects the tunable notch filter output to a frequency comparator component 350 of the FLL circuit. During tuning mode operation, while switched into the FLL, the tunable notch filter 315 operates as a VFO component of the FLL.

The FLL in the auto-tuning circuit 316 also includes a frequency comparator 350. A first terminal 353 of the frequency comparator 350 is coupled to the output terminal of the second loop filter integrator stage 321 of the tunable notch filter 315. The frequency comparator 350 senses a present frequency at which the tunable notch filter 315 is resonating. A second frequency comparator input terminal 355 is coupled to the sigma-delta modulator input terminal 110. The frequency comparator 350 senses a frequency of a reference signal appearing at the modulator input terminal 110 and compares the frequency of the reference signal to the present frequency at which the tunable notch filter 315 is resonating. The frequency comparator 350 generates an FLL error signal at an output terminal 358 of the frequency comparator 350. The magnitude of the FLL error signal is proportional to a difference between the present frequency at which the tunable notch filter 315 is resonating and the frequency of the reference signal.

The FLL of the auto-tuning circuit 316 also includes a tuning control circuit 365 coupled to the output terminal 358 of the frequency comparator 350. One or more output terminals of the tuning control circuit 365 are coupled to corresponding input terminal(s) of the tunable feedback element 325 of the tunable notch filter 315. The tuning control circuit 365 presents a tuning control signal, which may be digital or analog according to various embodiments, to the tunable feedback element 325. The tuning control signal causes the parametric value of the tunable feedback element 325 to vary in proportion to the magnitude of the FLL error signal. This process changes the present frequency at which the tunable notch filter 315 is resonating such as to drive the FLL error signal to zero. At that point in the operation of the FLL, the notch filter 315 is tuned to the frequency of the ADC input reference signal.

The auto-tuning circuit 316 further includes a tuning mode controller 375 coupled to the set of tuning mode switches (e.g., the tuning mode switches 330 and 335) and to the tuning control circuit 365. The tuning mode controller 375 changes the state of the set of tuning mode switches and enables/disables one or more outputs of the tuning control circuit 365 in response to a control signal received on a tuning mode controller input terminal 378. The tuning mode controller 375 thus causes the auto-tuning circuit 316 to enter and exit tuning mode operation.

Figure 4:
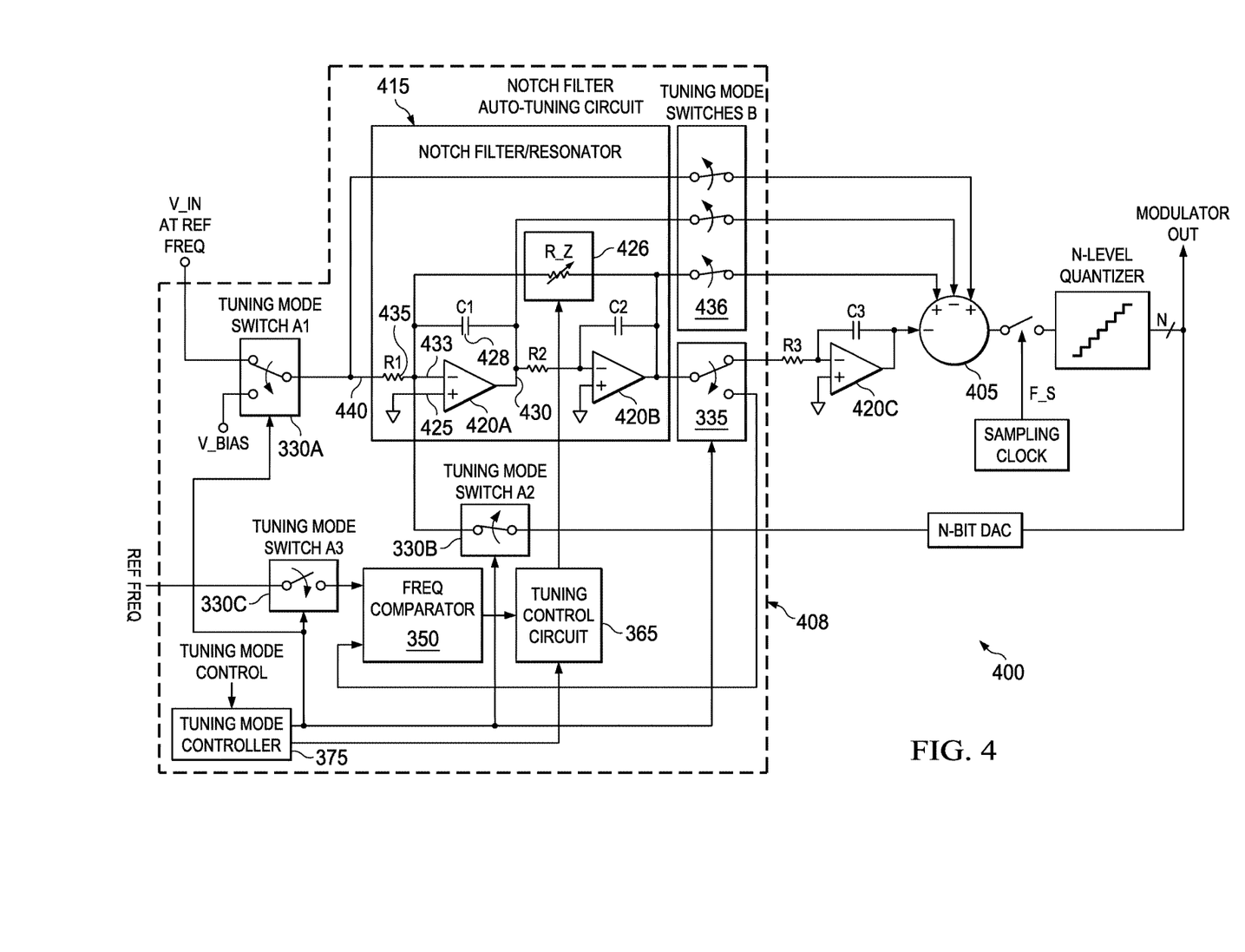
FIG. 4 is a schematic diagram of a sigma-delta modulator associated with an ADC according to various example embodiments.

FIG. 4 is a schematic diagram of a sigma-delta modulator 400 associated with an ADC according to various example embodiments. The modulator 400 includes the components previously described and coupled together with reference to FIG. 3 but includes additional detail applicable to some embodiments of the notch filter auto tuning circuit 408.

The modulator 400 includes a tunable notch filter 415 as the first two stages of a third-order loop filter according to various example embodiments. Signals from various stages of the loop filter are fed forward to a summing component 405. The modulator 400 also includes an auto-tuning circuit 408. The auto-tuning circuit 408, activated during notch filter tuning operations, includes tuning mode switches 330 and 335, frequency comparator 350, tuning control circuit 365 and tuning mode controller 375, all coupled together to operate as described above with reference to FIG. 3.

When activated, the auto-tuning circuit 408 isolates an input of the tunable notch filter 415 from the modulator input via tuning mode switch 330A and from modulator output feedback via tuning mode switch 330B. The tuning mode switch 330A also switches an input terminal of the notch filter 415 to a bias voltage to cause the notch filter 415 to resonate. The auto-tuning circuit isolates the notch filter 415 from succeeding loop filter stages via tuning mode switch 335 and from the summing component 405 via tuning mode switches 436. The tuning mode switch 335 also switches the notch filter 415 into an FLL portion of the auto-tuning circuit 408. There, the notch filter 415 operates as an FLL VFO component during tuning operations. A modulator input signal at a reference frequency is applied to the FLL frequency comparator 350 via tuning mode switch 330C.

The tunable notch filter 415 includes a first loop filter integrator stage, a second loop filter integrator stage, and a digitally tunable feedback impedance element 426. The first loop filter integrator stage includes a first operational amplifier 420A, a non-inverting input 425 of the first operational amplifier 420A coupled to a ground terminal. The first loop filter integrator stage also includes a first feedback capacitor 428 coupled between an output terminal 430 of the first operational amplifier 420A and an inverting input terminal 433. A first input resistor 435 is coupled between the inverting input 433 of the first operational amplifier 420A and a loop filter input terminal 440.

The second loop filter integrator stage is structured around a second operational amplifier 420B and is organized as described above for the first loop filter integrator stage, including a non-inverting input coupled to a ground terminal, a second feedback capacitor coupled between an output terminal of the second operational amplifier 420B and an inverting input terminal, and a second input resistor coupled between the inverting input terminal of the second operational amplifier 420B and an input to the second loop filter integrator stage.

The digitally tunable feedback impedance element 426 is coupled between the output terminal of the second loop filter integrator stage and the inverting input terminal of the first operational amplifier 420A. The digitally tunable notch filter formed by the above-described structures operates to modify the NTF associated with the sigma-delta modulator in order to limit in-band quantization noise around a center frequency to which the notch filter is tuned.

Figure 5:
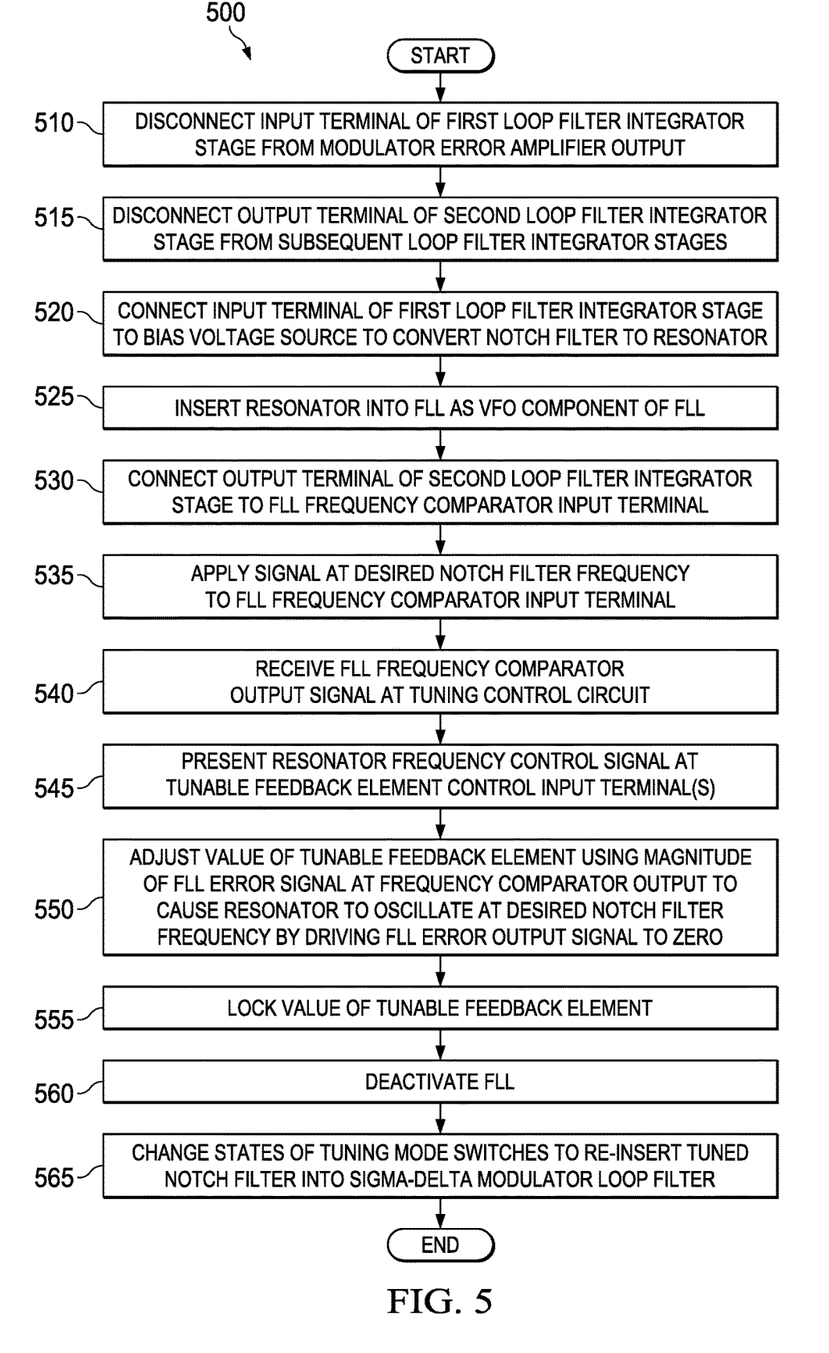
FIG. 5 is a flow diagram of a method of auto-tuning a notch filter portion of a loop filter in a sigma-delta ADC according to various example sequences.

FIG. 5 is a flow diagram of a method 500 of auto-tuning a notch filter portion of a loop filter in a sigma-delta ADC according to various example sequences. The method 500 includes isolating the notch filter portion of the loop filter in order to initiate a tuning mode of operation. The method 500 commences at block 510 with disconnecting the input terminal of the first loop filter integrator stage from a modulator error amplifier output terminal. The method 500 includes disconnecting the output terminal of the second loop filter integrator stage from subsequent loop filter integrator stages, at block 515.

The method 500 continues at block 520 with connecting the input terminal of the first loop filter integrator stage to a bias voltage source in order to convert the notch filter into a resonator during tuning mode operation. The method 500 includes inserting the resonator into an FLL circuit as a VFO component of the FLL, at block 525. Inserting the resonator into the FLL circuit includes connecting the output terminal of the second loop filter integrator stage to an input terminal of an FLL frequency comparator, at block 530. The method 500 also includes applying a reference signal at a desired notch filter frequency to an input terminal of a frequency comparator component of the FLL circuit, at block 535. The desired notch filter frequency is the center frequency of an expected input signal to an ADC employing the sigma-delta modulator.

The method 500 continues at block 540 with receiving an FLL error signal from an output terminal of the FLL frequency comparator at a tuning control circuit input and generating a resonator frequency control signal at the tuning control circuit. The method 500 includes presenting the frequency control signal to one or more control input terminals of the tunable feedback element, at block 545. The method 500 also includes adjusting a value of the tunable feedback element using a magnitude of an FLL error signal appearing at an output of the frequency comparator to cause the resonator to oscillate at the desired notch filter frequency by driving the magnitude of the FLL error signal to zero, at block 550. Some sequences of the method 500 include selecting a series/parallel sub-combination of resistors from a switched resistor network portion of the tunable feedback element according to a magnitude of the frequency control signal. Doing so determines an overall resistance value of the tunable feedback element.

The method 500 also includes latching the parametric value of the tuned feedback element prior to deactivating the FLL, at block 555, and subsequently deactivating the FLL, at block 560. The method 500 terminates with changing states of tuning mode switches to re-insert the notch filter into the modulator loop filter in order to exit the tuning mode of operation, at block 565.

Apparatus and methods described herein may be useful in applications other than increasing SNR in a sigma-delta ADC for narrow-band operation at a frequency exceeding the ADC NTF design by tuning a notch filter in the sigma delta modulator loop filter integration chain to a center frequency of the input signal. The examples of the apparatus 300 and 400 and the method 500 described herein are intended to provide a general understanding of the structures of various embodiments and the sequences of various methods. They are not intended to serve as complete descriptions of all elements and features of apparatus, systems and methods that might make use of these example structures and sequences.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Accordingly, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A notch filter auto-tuning apparatus associated with a loop filter in a sigma-delta modulator, comprising:
    a tunable notch filter portion of the modulator loop filter, the tunable notch filter capable of resonating when isolated from other portions of the loop filter;
    a frequency-locked loop ("FLL") circuit into which to insert the tunable notch filter as a variable frequency oscillator ("VFO") component of the FLL during a tuning mode of operation;
    a set of tuning mode switches coupled to input and output terminals of the tunable notch filter to isolate the notch filter from the other portions of the modulator loop filter and to insert the notch filter into the FLL during the tuning mode of operation; and
    a bias voltage source coupled to the input terminal of the tunable notch filter to present a bias voltage to the tunable notch filter as an energy source during the tuning mode of operation to cause the tunable notch filter to resonate.

2. The notch filter auto-tuning apparatus associated with the loop filter in the sigma-delta modulator of claim 1, the tunable notch filter further comprising:
    a first loop filter integrator stage;
    a second loop filter integrator stage; and
    a tunable feedback element coupled between an output terminal of the second loop filter integrator stage and an input terminal of the first loop filter integrator stage, a frequency of resonance of the tunable notch filter determined by a parametric value of the tunable feedback element.

3. The notch filter auto-tuning apparatus associated with the loop filter in the sigma-delta modulator of claim 2, the tunable feedback element further comprising:
    a switched resistor network from which to select a series/parallel sub-combination of resistors in order to establish the parametric value of the tunable feedback element as a resistance value.

4. The notch filter auto-tuning apparatus associated with the loop filter in the sigma-delta modulator of claim 2, the first and second loop filter integrator stages each further comprising:
    an operational amplifier, a non-inverting input of the operational amplifier coupled to a ground terminal;
    a feedback capacitor coupled between an output terminal of the operational amplifier and an inverting input terminal of the operational amplifier; and
    an input resistor coupled between the inverting input and an input to the integrator stage.

5. The notch filter auto-tuning apparatus associated with the loop filter in the sigma-delta modulator of claim 2, the FLL further comprising:
    a frequency comparator, a first terminal of the frequency comparator coupled to the output terminal of the second loop filter integrator stage of the tunable notch filter to sense a present frequency at which the tunable notch filter is resonating, a second frequency comparator input terminal coupled to a modulator input terminal to sense a frequency of a reference signal appearing at the modulator input terminal, the frequency comparator to compare the present frequency at which the tunable notch filter is resonating to the frequency of the reference signal and to generate an FLL error signal at an output terminal of the frequency comparator, a magnitude of the FLL error signal proportional to a difference between the present frequency at which the tunable notch filter is resonating and the frequency of the reference signal.

6. The notch filter auto-tuning apparatus associated with the loop filter in the sigma-delta modulator of claim 5, the FLL further comprising:
    a tuning control circuit coupled to the output terminal of the frequency comparator and to at least one input terminal associated with the tunable feedback element of the tunable notch filter, the tuning control circuit to present a tuning control signal to the tunable feedback element in order to vary the parametric value of the tunable feedback element in proportion to the magnitude of the FLL error signal and to change the present frequency at which the tunable notch filter is resonating such as to drive the FLL error signal to zero.

7. The notch filter auto-tuning apparatus associated with the loop filter in the sigma-delta modulator of claim 6, the tuning control signal being a binary word.

8. The notch filter auto-tuning apparatus associated with the loop filter in the sigma-delta modulator of claim 6, the set of tuning mode switches further comprising:
a first tuning mode switch coupled to the input terminal of the first loop filter integrator stage to disconnect a tunable notch filter input from a modulator error amplifier output terminal and to connect the tunable notch filter input to the bias voltage source; and
a second tuning mode switch coupled to the output terminal of the second loop filter integrator stage to disconnect a tunable notch filter output from subsequent loop filter integrator stages and to connect the tunable notch filter output to the frequency comparator.

9. The notch filter auto-tuning apparatus associated with the loop filter in the sigma-delta modulator of claim 6, further comprising:
a tuning mode controller coupled to the set of tuning mode switches and to the tuning control circuit, the tuning mode controller to enter the tuning mode of operation in response to a control signal received on a tuning mode controller input terminal, the tuning mode controller to change a state of the set of tuning mode switches and to enable at least one output of the tuning control circuit.

10. A notch filter auto-tuning apparatus associated with a loop filter in a sigma-delta modulator portion of an analog-to-digital converter ("ADC"), comprising:
a first loop filter integrator stage including a first operational amplifier, a non-inverting input of the first operational amplifier coupled to a ground terminal, a first feedback capacitor coupled between an output terminal of the first operational amplifier and an inverting input terminal of the first operational amplifier, and a first input resistor coupled between the inverting input of the first operational amplifier and a loop filter input terminal;
a second loop filter integrator stage including a second operational amplifier, a non-inverting input of the second operational amplifier coupled to a ground terminal, a second feedback capacitor coupled between an output terminal of the second operational amplifier and an inverting input terminal of the second operational amplifier, and a second input resistor coupled between the inverting input of the second operational amplifier and an input to the second loop filter integrator stage;
a digitally tunable feedback element coupled between an output terminal of the second loop filter integrator stage and an inverting input terminal of the first loop filter integrator stage, the first loop filter integrator stage, the second loop filter integrator stage, and the digitally tunable feedback element to form a digitally tunable notch filter to modify a noise transfer function ("NTF") associated with the sigma-delta modulator to limit in-band quantization noise around a center frequency to which the notch filter is tuned;
a frequency-locked loop ("FLL") circuit into which to insert the tunable notch filter as a variable frequency oscillator ("VFO") component of the FLL during a tuning mode of operation;
a set of tuning mode switches coupled to input and output terminals of the tunable notch filter to isolate the notch filter from the other portions of the modulator loop filter and to insert the notch filter into the FLL during the tuning mode of operation; and
a bias voltage source coupled to the input terminal of the tunable notch filter to present a bias voltage to the tunable notch filter as an energy source during the tuning mode of operation to cause the tunable notch filter to resonate.

11. The notch filter auto-tuning apparatus associated with the loop filter in the sigma-delta modulator of claim 10, the FLL further comprising:
a frequency comparator, a first terminal of the frequency comparator coupled to the output terminal of the second loop filter integrator stage of the tunable notch filter to sense a present frequency at which the tunable notch filter is resonating, a second frequency comparator input terminal coupled to a modulator input terminal to sense a frequency of a reference signal appearing at the modulator input terminal, the frequency comparator to compare the present frequency at which the tunable notch filter is resonating to the frequency of the reference signal and to generate an FLL error signal at an output terminal of the frequency comparator, a magnitude of the FLL error signal proportional to a difference between the present frequency at which the tunable notch filter is resonating and the frequency of the reference signal; and
a tuning control circuit coupled to the output terminal of the frequency comparator and to at least one input terminal associated with the tunable feedback element of the tunable notch filter, the tuning control circuit to present a tuning control signal to the tunable feedback element in order to vary the parametric value of the tunable feedback element in proportion to the magnitude of the FLL error signal and to change the present frequency at which the tunable notch filter is resonating such as to drive the FLL error signal to zero.

12. The notch filter auto-tuning apparatus associated with the loop filter in the sigma-delta modulator of claim 11, further comprising:
a tuning mode controller coupled to the set of tuning mode switches and to the tuning control circuit, the tuning mode controller to enter the tuning mode of operation in response to a control signal received on a tuning mode controller input terminal, the tuning mode controller to change a state of the set of tuning mode switches and to enable at least one output of the tuning control circuit.

13. A method of auto-tuning a notch filter portion of a loop filter in a sigma-delta modulator, comprising:
isolating the notch filter portion of the loop filter in order to initiate a tuning mode of operation, the notch filter formed by coupling a tunable feedback element between an input terminal of a first loop filter integrator stage and an output terminal of a second loop filter integrator stage;
transforming the notch filter into a resonator by applying a bias voltage to the input terminal of the first loop filter integrator stage of the isolated notch filter;
inserting the resonator into a frequency-locked loop ("FLL") circuit as a variable frequency oscillator ("VFO") component of the FLL; and
applying a reference signal at a desired notch filter frequency to an input terminal of a frequency comparator component of the FLL circuit.

14. The method of auto-tuning the notch filter portion of the loop filter in the sigma-delta modulator of claim 13, further comprising:

adjusting a value of the tunable feedback element using a magnitude of an FLL error signal appearing at an output of the frequency comparator to cause the resonator to oscillate at the desired notch filter frequency by driving the magnitude of the FLL error signal to zero.

15. The method of auto-tuning the notch filter portion of the loop filter in the sigma-delta modulator of claim 13, the desired notch filter frequency being a center frequency of an expected input signal to an analog-to-digital converter ("ADC") employing the sigma-delta modulator.

16. The method of auto-tuning the notch filter portion of the loop filter in the sigma-delta modulator of claim 13, isolating the notch filter portion of the loop filter further comprising:

disconnecting the input terminal of the first loop filter integrator stage from a modulator error amplifier output terminal; and connecting the input terminal of the first loop filter integrator stage to a bias voltage source.

17. The method of auto-tuning the notch filter portion of the loop filter in the sigma-delta modulator of claim 13, isolating the notch filter portion of the loop filter further comprising:

disconnecting the output terminal of the second loop filter integrator stage from subsequent loop filter integrator stages; and connecting the output terminal of the second loop filter integrator stage to an input terminal of an FLL frequency comparator.

18. The method of auto-tuning the notch filter portion of the loop filter in the sigma-delta modulator of claim 13, further comprising:

at a tuning control circuit, receiving an FLL error signal from an output terminal of the FLL frequency comparator;

generating a resonator frequency control signal at the tuning control circuit; and presenting the frequency control signal to at least one control input terminal of the tunable feedback element.

19. The method of auto-tuning the notch filter portion of the loop filter in the sigma-delta modulator of claim 18, further comprising:

selecting a series/parallel sub-combination of resistors from a switched resistor network portion of the tunable feedback element according to a magnitude of the frequency control signal in order to establish a resistance value of the tunable feedback element.

20. The method of auto-tuning the notch filter portion of the loop filter in the sigma-delta modulator of claim 13, further comprising:

changing states of a plurality of tuning mode switches to re-insert the notch filter into the modulator loop filter in order to exit the tuning mode of operation.

* * * * *